US005763141A

United States Patent [19]

Shimomura et al.

[11] Patent Number: 5,763,141

[45] Date of Patent: Jun. 9, 1998

[54] LIQUID JET RECORDING HEAD, A MANUFACTURING METHOD THEREOF AND A LIQUID JET RECORDING APPARATUS HAVING SAID RECORDING HEAD

[75] Inventors: Akihiko Shimomura; Isao Imamura, both of Yokohama, Japan

[73] Assignee: Canon Kabushiki Kaisha, Tokyo, Japan

[21] Appl. No.: 338,835

[22] Filed: Nov. 14, 1994

[30] Foreign Application Priority Data

Nov. 12, 1993 [JP] Japan .................................. 5-283601

[51] Int. Cl.[6] .................................................. G03F 7/00

[52] U.S. Cl. ............................................ 430/320; 430/138

[58] Field of Search .................................... 430/311, 315, 430/320, 324, 329, 330, 138

[56] References Cited

U.S. PATENT DOCUMENTS 4,657,631 4/1987 Noguchi .................................. 156/655

5,030,317 7/1991 Noguchi .................................. 156/630

5,478,606 12/1995 Ohkuma .................................. 427/555

FOREIGN PATENT DOCUMENTS 61-154947 7/1986 Japan .

62-253457 11/1987 Japan .

*Primary Examiner*—Kathleen Duda

*Attorney, Agent, or Firm*—Fitzpatrick, Cella, Harper & Scinto

[57] ABSTRACT

A manufacturing method for manufacturing a liquid jet recording head comprises the steps of: forming a solid layer having a pattern of a liquid path communicating with a discharge port through which a liquid is discharged on a substrate; coating the solid layer with a curable material including a micro-capsuled curing agent; curing the curable material by mixing the micro-capsuled curing agent into a main agent of the curable material; and forming a wall of the liquid path comprised of the cured curable material and the substrate by removing the solid layer.

5 Claims, 3 Drawing Sheets

LIQUID JET RECORDING HEAD, A MANUFACTURING METHOD THEREOF AND A LIQUID JET RECORDING APPARATUS HAVING SAID RECORDING HEAD

BACKGROUND OF THE INVENTION

1. Field of the Invention

The present invention relates to a liquid jet (ink jet) recording head of the type of performing the recording in such a manner as to discharge minute droplets of the recording liquid, commonly referred to as the ink, through fine openings, flying them, for sticking onto the recording face, its manufacturing method, and a liquid jet recording apparatus having the recording head.

2. Related Background Art

The liquid jet recording head typically comprises fine recording liquid discharge openings (orifices), liquid flow paths, and liquid discharge energy generating elements provided within the liquid flow paths.

Conventionally, a typical method for fabricating such a liquid jet recording head has been well-known as disclosed in U.S. Pat. No. 4,657,631 (Japanese Laid-Open Patent Application No. 61-154947) and U.S. Pat. No. 5,030,317 (Japanese Laid-Open Patent Application No. 62-253457), for example, and is described below (see FIGS. 1A to 1G).

First, a photosensitive resin layer 2 (for example, positive photoresist) is formed on a treated substrate 1 (see FIG. 1A), exposed to light through a mask 3 (see FIG. 1B), and then patterned by processing to form a solid layer on the treated substrate (see FIG. 1C).

Next, a liquid flow path forming material 5 of the active energy or heat curable type is coated over the patterned solid layer (see FIG. 1D), and cured by applying active energy ray or heat to form a liquid flow path forming member 5*a* (see FIG. 1F).

Further, the patterned solid layer is dissolved and removed, using an organic solvent such as halogen containing hydrocarbon, ketone, ester, ether or alcohol, or an alkaline aqueous solution such as sodium hydroxide or potassium hydroxide, to form liquid flow paths 7 (see FIG. 1G).

In the above process, to secure principally the outside dimension of the head, after the liquid flow path forming material 5 is coated and after a second substrate 6 such as a glass (see FIG. 1E) is covered, and the material 5 is cured to form an ink jet recording head.

In the manufacturing method of the ink jet head as above described, one-liquid curable material is usually used as the liquid flow path forming material.

It is generally said that one-liquid curable material of the type of already containing a curing agent before curing to start curing with the action of active energy or heat is more excellent in the uniform dispersion of the curing agent in the material, and in the uniformity of the degree of curing, than two-liquid curable material of the type of not containing a curing agent before curing but only mixing the curing agent at the time of curing. In practice, the use of two-liquid curable material as the liquid flow path forming material in the manufacturing method of the ink jet head as above can not be said to be very practical, considering that the curing agent must be mixed later and uniformly.

The use of one-liquid curable material of active energy ray curable type as the liquid channel head in the manufacturing method of the ink jet head is excellent in the uniformity of the degree of curing or the ease of process because it is only necessary to apply the active energy ray (hereinafter also referred to as "light") to the material having a curing agent dispersed uniformly. However, since it is desirable that the liquid flow path forming material or covering substrate continues to be transparent also in curing to apply the active energy uniformly, there is a problem in the degree of freedom in choosing the material.

In the above process, the manner of using a heat curable material for the liquid flow path forming material has merits particularly in the respect of cost, because the heat curable material is curable with a simple heat oven, not requiring the active energy irradiation, and has the degree of freedom in choosing the material, not requiring that the liquid flow path forming material or covering substrate can transmit the active energy after covering the liquid flow path forming material.

However, in using the heat curable material as above, there are following problems can not be overlooked:

(1) The heat curable material, typically requiring the curing at relatively high temperatures above 150° C., may yield a great stress in the interface between substrates due to thermal contraction, upon turning back to the ordinary temperature after the curing, causing exfoliation between laminations under severe conditions, e.g., very low temperatures.

(2) The solid layer such as a positive photo-resist exhibits a solvent insolubility which may be possibly caused by bridge reaction, when subjected to high temperatures, which will make it difficult to dissolve and remove the solid layer for forming the liquid flow paths.

SUMMARY OF THE INVENTION

It is an object of the present invention to resolve the above-mentioned problems, and provide an ink jet recording head which has high reliability and excellent discharge precision without yielding exfoliation at high or low temperatures, and a manufacturing method of said recording head, and an ink jet recording apparatus having said recording head.

To achieve the object, the present invention provides a manufacturing method for manufacturing a liquid jet recording head, said method comprising the steps of:

forming a solid layer having a pattern of a liquid path communicating with a discharge port through which a liquid is discharged on a substrate;

coating said solid layer with a curable material including a micro-capsuled curing agent;

curing said curable material by mixing said micro-capsuled curing agent into a main agent of said curable material; and forming a wall of said liquid path comprised of said cured curable material and said substrate by removing said solid layer.

The present invention also provides a liquid jet recording head manufactured by a manufacturing method for manufacturing a liquid jet recording head, said method comprising the steps of: forming a solid layer having a pattern of a liquid path communicating with a discharge port through which a liquid is discharged on a substrate; coating said solid layer with a curable material including a micro-capsuled curing agent; curing said curable material by mixing said micro-capsuled curing agent into a main agent of said curable material; and forming a wall of said liquid path comprised of said cured curable material and said substrate by removing said solid layer.

The present invention further provides a liquid jet recording apparatus comprising:

a liquid jet recording head a liquid jet recording head manufactured by a manufacturing method for manufacturing a liquid jet recording head, said method comprising the steps of: forming a solid layer having a pattern of a liquid path communicating with a discharge port through which a liquid is discharged on a substrate; coating said solid layer with a curable material including a micro-capsuled curing agent; curing said curable material by mixing said micro- capsuled curing agent into a main agent of said curable material; and forming a wall of said liquid path comprised of said cured curable material and said substrate by removing said solid layer; and a member for mounting said recording head.

The features of the present invention will be described below.

By a micro-capsuled curing agent for use in the invention is meant one in which a highly active curing agent, curable at ordinary temperature, is enclosed into a capsule which can be broken at relatively low temperatures but above the ordinary temperature.

A curable material containing a micro-capsuled curing agent can be said to be macroscopically one liquid curable material, because the curing agent is already dispersed therein uniformly, and the curing is started by breaking the micro-capsule normally with the action of heat, but microscopically two-liquid curable material because the curing agent is separated by a micro-capsule shell, and not mixed. This curable material can be said to have the advantages of both one liquid curable material and two-liquid curable material.

A liquid flow path forming material containing the micro-capsuled curing agent is covered on the solid layer patterned, and then the curing reaction is started by breaking the capsule at low temperatures from 60° to 80° C.

The solid layer is dissolved and removed at stage where it is cured to the extent of fully exhibiting the solvent resistance, and may be post-cured at high temperature, if necessary.

In this way, the curing at low temperatures results in less thermal contraction, with substantially no stress on the interface between substrates. Also, the solid layer such as a positive photo-resist can be easily dissolved and removed because it is not subjected to high temperatures.

Further, in manufacturing the recording head in accordance with the manufacturing method of the invention, there is an effect that the recording head can be manufactured cheaply without requiring an expensive apparatus such as an energy irradiation apparatus.

DETAILED DESCRIPTION OF THE PREFERRED EMBODIMENTS

The present invention will be now described in accordance with embodiments, but the invention is not limited to them.

EXAMPLE 1

A manufacturing method of a liquid jet recording head according to example 1 will be described with reference to FIGS. 1A to 1G. An epoxy resin composition of low temperature curable type was prepared by blending components as listed in Table 1 below as an epoxy resin and a curing agent.

TABLE 1

| Epoxy resin composition (example 1) | |
|---|---|
| Epoxy made by Yuka Shell (Epicoat 828) | 85 parts |
| Epoxy made by Ciba Geigy (DY022) | 10 parts |
| Epoxy type silane made by The Shin-Etsu Chemical | 5 parts |
| Micro-capsuled curing agent made by Asahi Kasei Chemical Industry Co., Ltd. (Novacure HX-3722) | 60 parts |

Figure 1A:
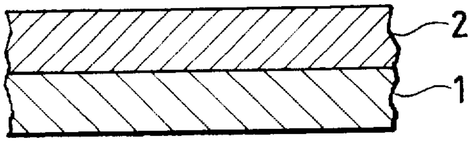
FIGS. 1A to 1G are typical cross-sectional views showing manufacturing methods of a liquid jet recording head.
Figure 1B:
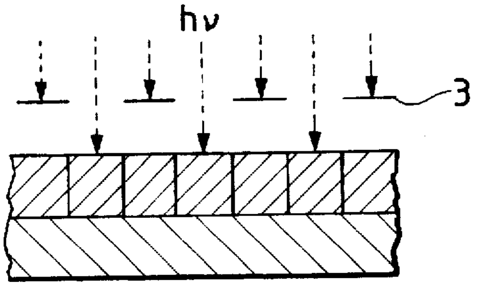

A positive photo-resist AZ-4903 (made by Hoechst) was spin-coated 30 1μm in film thickness on a silicone substrate 1 having electricity-heat converters formed thereon as the liquid discharge energy generating element, and prebaked at 90° C. in an oven for forty minutes to form a resist layer 2 (FIG. 1A).

Figure 1C:
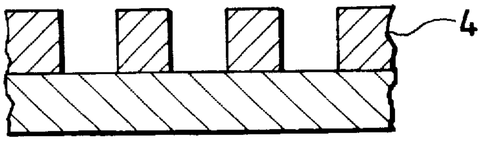

This resist layer was pattern exposed to light through a mask pattern of liquid flow paths comprising liquid channels communicating to discharge openings and a liquid chamber communicating to the liquid channels with an exposure amount of 800 mJ/cm$^2$, using a mask aligner (PLA-501 made by Canon), developed using an aqueous solution of sodium hydroxide of 0.75 wt % (FIG. 1B), then rinsed with ion exchange water, and post-baked at 70° C. for 30 minutes to obtain a solid layer 4 composed of a resist pattern (FIG. 1C).

Figure 1D:
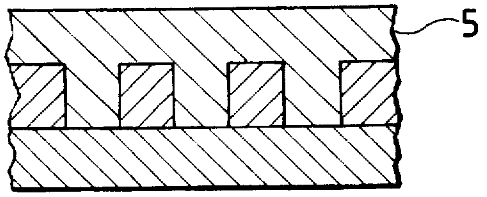
Figure 1E:
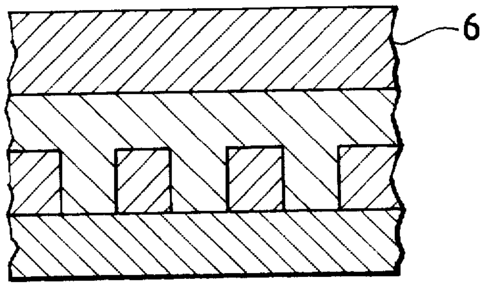
Figure 1F:
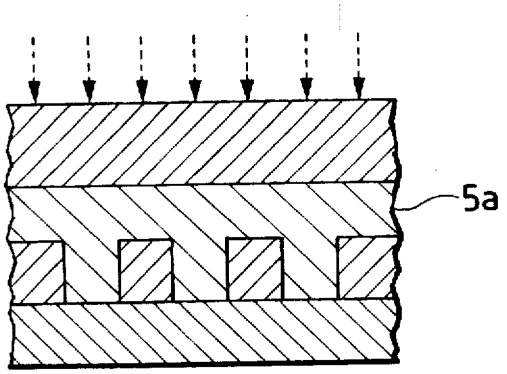

Then, a liquid flow path forming material 5 composed of the epoxy resin composition of low temperature curable type prepared ahead was applied on the resist pattern of liquid flow path portion by a micro-dispenser (FIG. 1D), on which a glass substrate 6 was covered (FIG. 1E), and the cured at 80° C. for 2 hours to form a liquid flow path forming member 5a (FIG. 1F).

Further, the top portion of the head was cut off using a blade of resinoid bond #2500 (made by Noritake) with a dicing saw (U-FM-5A/T made by Tokyo Seimitsu) to form a discharge opening face.

Figure 1G:
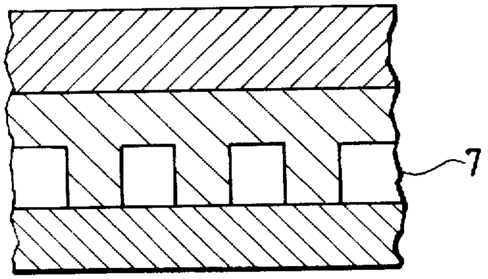

After cutting, the head was immersed in acetone to dissolve and remove the solid layer 4 composed of the resist pattern to form liquid flow paths (FIG. 1G).

As a result of observing the discharge opening face of the head thus fabricated with an optical microscope, it was revealed that the highly reliable head could be obtained without fault such as defect, crack or flaw, resist residue, and exfoliation due to temperature changes.

Further, using a liquid jet recording apparatus comprising the liquid jet recording head fabricated in the above way, a print test was attempted.

The test conditions were such that the density of discharge openings was 360 dpi, the number of discharge openings was 1344, the discharge frequency was 2.84 kHz, and the used ink was DEG 15% water base ink (containing 3% dye).

As a result, the printing could be performed quite stably.

EXAMPLE 2

A manufacturing method of a liquid jet recording head according to example 2 will be described with reference to FIGS. 1A to 1G. An epoxy resin composition of low temperature curable type was prepared by blending components as listed in Table 2 below as an epoxy resin and a curing agent.

TABLE 2

| Epoxy resin composition (example 2) | |
|---|---|
| Epoxy made by Yuka Shell (Epicoat 828) | 85 parts |
| Epoxy made by Ciba Geigy (DY022) | 10 parts |
| Epoxy type silane made by The Shin-Etsu Chemical | 5 parts |
| Micro-capsuled curing agent made by Asahi Kasei Chemical Industry Co., Ltd. (Novacure HX-3155) | 100 parts |

A positive photo-resist AZ-4903 (made by Hoechst) was spin-coated 30 μm in film thickness on a silicone substrate 1 having electricity-heat converters formed thereon as the liquid discharge energy generating element, and prebaked at 90° C. in an oven for forty minutes to form a resist layer 2 (FIG. 1A).

This resist layer was exposed in pattern to light through a mask pattern of liquid flow path portion with an exposure amount of 800 mJ/cm$^2$, using a mask aligner (PLA-501 made by Canon), developed using an aqueous solution of sodium hydroxide of 0.75 wt% (FIG. 1B), then rinsed with ion exchange water, and post-baked at 70° C. for 30 minutes to obtain a solid layer 4 composed of resist pattern (FIG. 1C).

Then, a liquid flow path forming material 5 composed of the epoxy resin composition of low temperature curable type prepared ahead was applied on the resist pattern of a liquid flow path portion by a micro-dispenser (FIG. 1D). A defoaming process was performed within a vacuum chamber for 5 minutes. A PPS (polyphenylene sulfide) resin substrate 6 having opened a supply port was bonded thereto (FIG. 1E). Then the liquid flow path forming material was cured at 80° C. for 2 hours to form a liquid flow path forming member 5*a*.

Further, the top portion of the head was cut off using a blade of resinoid bond #2500 (made by Noritake) with a dicing saw (U-FM-5A/T made by Tokyo Seimitsu) to form a discharge opening face.

After cutting, the head was immersed in acetone to dissolve and remove the solid layer 4 composed of resist pattern to form liquid flow paths 7 (FIG. 1G).

As a result of observing the discharge opening face of the head thus fabricated with an optical microscope, it was revealed that the highly reliable head could be obtained without fault such as defect, crack or flaw, resist residue, and exfoliation due to temperature changes.

Further, using a liquid jet recording apparatus comprising the liquid jet recording head fabricated in the above way, a print test was attempted under the same test conditions as in example 1.

As a result, the printing could be performed quite stably.

Figure 2:
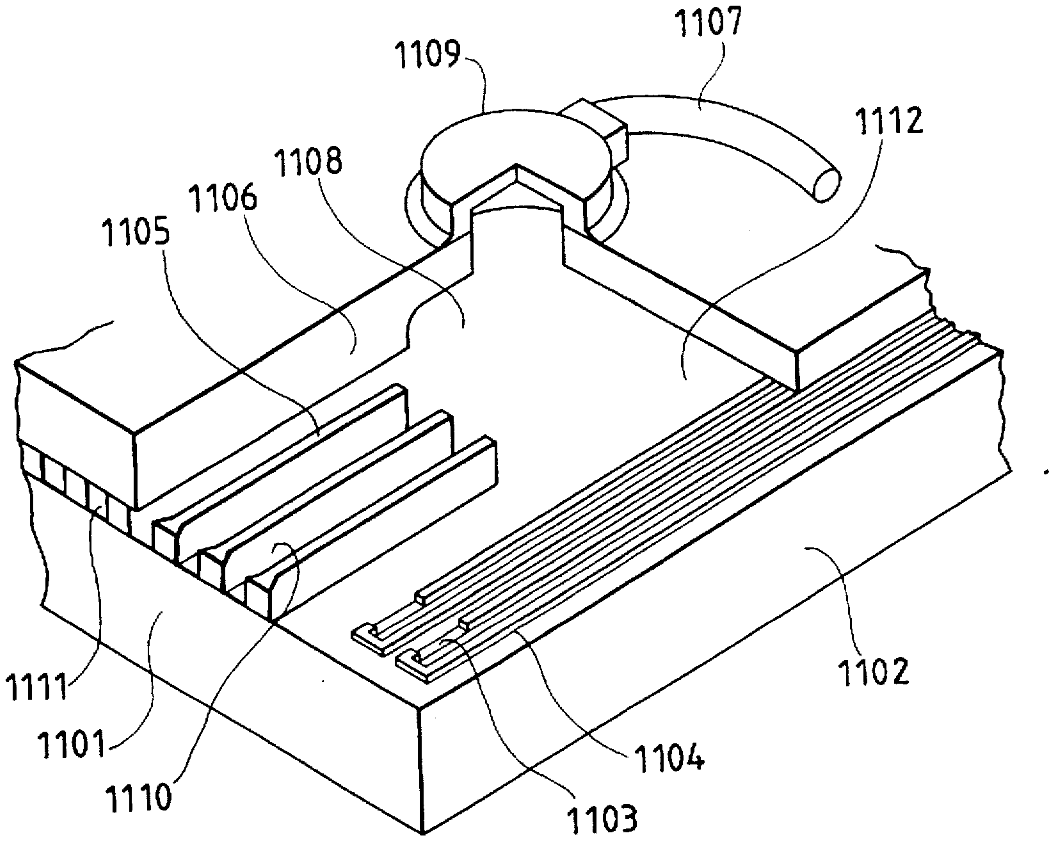
FIG. 2 is a typical perspective view showing a liquid jet recording apparatus, partly broken.

FIG. 2 is a schematic constitutional view of such an ink jet recording head, which is comprised of electricity-heat converters 1103 formed as the film on the substrate 102 through the semiconductor manufacturing process including etching, evaporation and sputtering, electrodes 1104, liquid channel walls 1105, and a ceiling plate 1106. However, the recording liquid 1112 is supplied from a liquid reservoir, not shown, through a liquid supply tube 1107 to a common liquid chamber 1108 of the recording head 1101. In FIG. 2, 1109 is a connector for the liquid supply tube. The liquid 1112 supplied to the common liquid chamber 1108 is supplied into the liquid channels owing to a so-called capillary phenomenon, and stably held owing to meniscus formed in the ink discharge port face (orifice face) at the top end of liquid channels. Here, by energizing to the electrothermal converting members 1103, the liquid on the surface of the electrothermal converting members is heated rapidly, producing bubbles in the liquid channels, so that the liquid is discharged through ink discharge ports 1111 by expansion and shrinkage of bubbles to form liquid droplets. With the above constitution, it is possible to form an ink jet recording head of the multi-nozzle comprised of 128 or 256 discharge ports with an array of discharge ports at a high discharge port density of 16 nozzles/mm, further the discharge ports extending over an entire area of the recording width.

Figure 3:
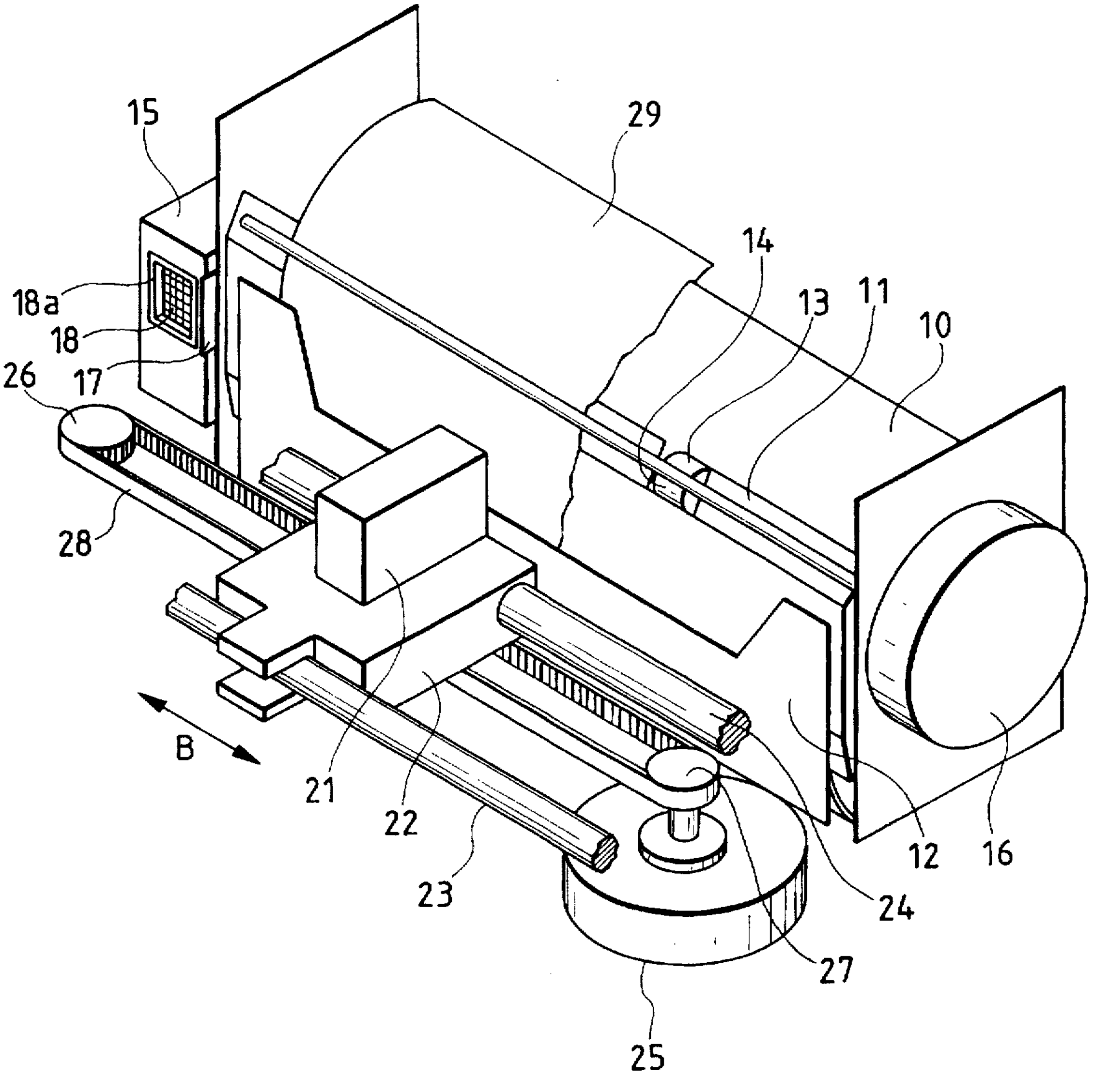
FIG. 3 is a typical perspective view showing the essence of a liquid jet recording apparatus.

FIG. 3 is a perspective view schematically showing the external configuration of an ink jet recording apparatus. In FIG. 3, 21 is an ink jet recording head (hereinafter referred to as a recording head) for recording a desired image by discharging the ink based on a predetermined recording signal, and 22 is a carriage movable for scanning in a direction of recording line (main scan direction) with the recording head 21 mounted thereon. The carriage 22 is supported slidably by guide shafts 23, 24, reciprocated in the main scan direction in connection with a timing belt 28. The timing belt 28 engaging pulleys 26, 27 is driven through a pulley 27 by a carriage motor 25.

A recording paper 29 is guided by a paper pan 10, and conveyed by a paper feed roller, not shown, which is pressed by a pinch roller. This conveyance is performed by a paper feed motor 16 as a driving source. The recording paper 29 conveyed is tensioned by a paper ejecting roller 13 and a spur 14, and pressed against a heater 11 by a paper presser plate 12 formed of an elastic member, the recording paper thus being conveyed in close contact with the heater 11. The recording paper 29 on which the ink jetted or discharged from the head 21 has been attached is warmed by the heater, the attached ink being fixed with its water content being evaporated. 15 is a unit referred to as a recovery system for maintaining the discharge characteristic in the regular state by removing the foreign matter or thickened ink adhering to discharge ports (not shown) of the recording head 21. 18*a* is a cap which constitutes a part of the recovery system unit 15, capping the discharge port face of the ink jet recording head 1 to prevent the clogging from occurring. An ink absorbing member 18 is disposed within the cap 18*a*.

Also, a cleaning blade 17 for cleaning the foreign matter or ink droplets adhering to the discharge port face by making contact with the discharge port formed face of the recording head 21 is provided on the side of the recovery system unit 15 closer to the recording area.

What is claimed is:

1. A manufacturing method for manufacturing a liquid jet recording head, said method comprising the steps of:

forming on a substrate a solid layer having a pattern of a liquid path, said liquid path having a wall, said liquid path communicating with a discharge port through which a liquid is discharged;

coating said solid layer with a curable resin comprising a main agent and a plurality of micro-capsules, each containing a curing agent, said micro-capsules being distributed in said main agent;

curing said curable resin by heating and destroying at least some of the micro-capsules and reacting the curing agent with the main agent to form a cured curable resin; and removing said solid layer to form the wall of said liquid path comprising said cured curable resin and said substrate.

2. A method according to claim 1, wherein said micro-capsules is mixed into the main agent of said curable resin by applying heat.

3. A method according to claim 1, wherein said solid layer is formed by irradiating light in response to the pattern onto a layer of photosensitive material provided on said substrate utilizing a difference in solubility caused in said photosensitive material by said irradiating light.

4. A method according to claim 3, wherein said photosensitive material is a positive photosensitive resin.

5. A manufacturing method according to claim 1, wherein the curing agent cures at a room temperature.

* * * * *

UNITED STATES PATENT AND TRADEMARK OFFICE
CERTIFICATE OF CORRECTION

PATENT NO. : 5,763,141

DATED : June 9, 1998

INVENTOR(S) : AKIHIKO SHIMOMURA, ET AL.

It is certified that error appears in the above-identified patent and that said Letters Patent is hereby corrected as shown below:

COLUMN 2

Line 19, "can" should read --that can--.

COLUMN 3

Line 3, "a liquid jet recording head" (second occurrence) should be deleted;
Line 10, "micro- capsuled" should read --micro-capsuled--;
Line 24, "one liquid" should read --one-liquid--;
Line 30, "one liquid" should read --one-liquid--; and
Line 36, "at" should read --at the--.

COLUMN 4

Line 37, "the cured" should read --then cured--.

COLUMN 6

Line 43, "15 is" should read --¶ 15 is--; and
Line 46, "18a" should read --¶ 18a--.

UNITED STATES PATENT AND TRADEMARK OFFICE
CERTIFICATE OF CORRECTION

PATENT NO. : 5,763,141

DATED : June 9, 1998

INVENTOR(S) : AKIHIKO SHIMOMURA, ET AL.

It is certified that error appears in the above-identified patent and that said Letters Patent is hereby corrected as shown below:

COLUMN 7

Line 9, "capsules is" should read --capsules are--.

Signed and Sealed this

Second Day of March, 1999

Attest:

Q. TODD DICKINSON

Attesting Officer

*Acting Commissioner of Patents and Trademarks*